(12) United States Patent
Ivanov et al.

(10) Patent No.: US 7,046,099 B2
(45) Date of Patent: May 16, 2006

(54) TEMPERATURE COMPENSATED OSCILLATOR

(75) Inventors: Eugene Nikolay Ivanov, Crawley (AU); Michael Edmund Tobar, Crawley (AU); John Gideon Hartnett, Crawley (AU)

(73) Assignees: Poseidon Scientific Instruments Pty Ltd, Fremantle (AU); The University of Western Australia, Nedlands (AU)

( * ) Notice: Subject to any disclaimer, the term of this patent is extended or adjusted under 35 U.S.C. 154(b) by 9 days.

(21) Appl. No.: 10/836,437

(22) Filed: Apr. 30, 2004

(65) Prior Publication Data

US 2004/0263268 A1 Dec. 30, 2004

Related U.S. Application Data

(63) Continuation of application No. PCT/AU02/01466, filed on Oct. 30, 2002.

(51) Int. Cl.
*H03L 1/02* (2006.01)
*H03B 21/01* (2006.01)
*H03B 5/18* (2006.01)

(52) U.S. Cl. .......................... 331/176; 331/37; 331/41; 331/46; 331/96

(58) Field of Classification Search .................. 331/37, 331/41, 46, 65, 66, 96, 107 DP, 117 D, 175, 331/176
See application file for complete search history.

(56) References Cited

U.S. PATENT DOCUMENTS 5,652,556 A * 7/1997 Flory et al. ............... 333/219.1

FOREIGN PATENT DOCUMENTS

WO    WO 03/038943    *   5/2003

* cited by examiner

*Primary Examiner*—David Mis
(74) *Attorney, Agent, or Firm*—Clark Hill PLC

(57) ABSTRACT

An oscillator having a desired output frequency, comprising a cavity resonator 102 loaded with an anisotropic dielectric material and an oscillator circuit 100 including the cavity resonator 102 as a frequency determining element, the oscillator circuit 100 arranged to operate the cavity resonator 102 at a first frequency in a first mode and at a second frequency in a second mode, the first mode and the second mode each being influenced to a different extent by the thermal coefficient of permittivity of at least one crystal axis of the dielectric material, the oscillator circuit arranged to produce the desired operating frequency from the first frequency and the second frequency. The first frequency and the second frequency differ by an amount corresponding to the desired output frequency.

24 Claims, 3 Drawing Sheets

Spacing between modes $TE_{14,1,1}$ and $TM_{11,1,1}$ as a function of temperature

TEMPERATURE COMPENSATED OSCILLATOR

This is a continuation of International Application PCT/AU02/01466, with an international filing date of Oct. 30, 2002.

FIELD OF THE INVENTION

This invention relates to a temperature compensated oscillator, and in particular to a temperature compensated oscillator using a single, dielectrically-loaded cavity resonator.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The following discussion of the background to the invention is intended to facilitate an understanding of the present invention. However, it should be appreciated that the discussion is not an acknowledgement or admission that any of the material referred to was published, known or part of the common general knowledge as at the priority date of the application.

One of the performance criteria for oscillators is frequency stability. The application the oscillator is used in will determine the extent to which short term and/or medium to long term frequency stability is required.

A dielectrically loaded cavity resonator is sensitive to temperature fluctuations in the cavity resonator. As the temperature of the cavity resonator changes, the dielectric constant of the dielectric material in the cavity resonator will also change according to its thermal coefficient of permittivity. This results in corresponding changes in the resonant frequency of the cavity resonator. Where an oscillator uses the dielectrically loaded cavity resonator as its frequency determining element, temperature fluctuations in the cavity resonator will affect the frequency stability of the oscillator because the operating frequency of an oscillator using the dielectrically loaded cavity resonator will also change with temperature.

In an attempt to reduce the effects of this phenomena, many prior art oscillators use thermal control systems to hold the cavity resonator within a narrow temperature range to improve the oscillator's frequency stability. However, such systems are still prone to long term frequency drift resulting from temperature changes within the controlled range.

Many dielectric materials are anisotropic and accordingly have multiple thermal coefficients of permittivity, corresponding to the axes of the dielectric material's crystal structure. For example, sapphire has two thermal coefficients of permittivity, $TCP_z$ and $TCP_\perp$.

There have been attempts at reducing the effects of an anisotropic dielectric material's thermal coefficients of permittivity on the frequency stability of an oscillator using the dielectric material. Such systems typically operate the cavity resonator in two modes simultaneously—a transverse magnetic ("TM")-mode and a transverse electric ("TE")-mode, making use of the anisotropy of the thermal coefficient of permittivity in the dielectric material to give an indication of frequency drift. The operating frequencies of the TM-mode and the TE-mode are chosen to be different by a small amount, so that when the two signals are mixed together, the result is a lower frequency signal that is compared to a reference signal at the same lower frequency to provide an indication of the frequency drift of the oscillator. For example, for an oscillator operating at 9 GHz, two modes separated by 79 MHz may be used, such as 9.000 GHz and 9.079 GHz. The lower frequency 79 MHz signal, produced by mixing the 9.000 GHz and 9.079 GHz signals together, is then mixed with a local 79 MHz source to produce an error signal, which is then used as a control signal in a feedback system to reduce the frequency drift of the oscillator and consequently improve the oscillator's frequency stability. One drawback of this system is that frequency stability of the local source limits the frequency stability of the oscillator.

SUMMARY OF THE INVENTION

In accordance with a first aspect of this invention, there is provided an oscillator having a desired output frequency, comprising:

A cavity resonator loaded with an anisotropic dielectric material; and

An oscillator circuit including the cavity resonator as a frequency determining element, the oscillator circuit arranged to operate the cavity resonator at a first frequency in a first mode and at a second frequency in a second mode, the first mode and the second mode each being influenced to a different extent by the thermal coefficient of permittivity of at least one crystal axis of the dielectric material, the oscillator circuit arranged to produce the desired operating frequency from the first frequency and the second frequency.

Preferably, the first mode and the second mode are each influenced by the thermal coefficient of permittivity of a different crystal axis of the dielectric material.

Preferably, the first frequency and the second frequency differ by an amount corresponding to the desired output frequency.

Preferably, the oscillator circuit comprises mixing means responsive to the first frequency and the second frequency to produce the desired output frequency.

Preferably, the first frequency and the second frequency are chosen so that for a desired temperature range, the first frequency and the second frequency change by substantially the same amount.

In one arrangement, the first mode is a TE-mode or a quasi TE-mode and the second mode is a TM-mode or a quasi TM-mode.

In an alternative arrangement, the first mode is a TM-mode or a quasi TM-mode and the second mode is a TE-mode or a quasi TE-mode.

Preferably, the quasi TE-mode and the quasi TM-mode are moderate-order whispering gallery modes.

Preferably, the oscillator circuit further comprises a first loop oscillator operable at the first frequency and a second loop oscillator operable at the second frequency.

Preferably, the first loop oscillator includes a first Pound stabilisation circuit.

Preferably, the second loop oscillator includes a second Pound stabilisation circuit.

More preferably, said second loop oscillator further comprises a first mixer, a microwave amplifier operable at the desired output frequency, and a second mixer provided in the loop of the second loop oscillator, the first mixer being responsive to the first frequency and the second frequency to produce the desired output frequency, the desired output frequency being input to the microwave amplifier, and the second mixer being responsive to the desired output frequency and the first frequency to produce the second frequency, wherein the second Pound stabilisation circuit is arranged to reduce noise effects of the microwave amplifier and the first and second mixers.

In accordance with a second aspect of this invention, there is provided a method for producing a desired output frequency, comprising the steps of:

Using a cavity resonator loaded with an anisotropic dielectric material as a frequency determining element in an oscillator circuit at a first frequency in a first mode and at a second frequency in a second mode;

Choosing the first mode and the second mode to each be influenced to a different extent by the thermal coefficient of permittivity of at least one crystal axis of the dielectric material; and Producing the desired output frequency from the first frequency and the second frequency.

Preferably, the step of choosing the first mode and the second mode comprises determining different crystal axes of the dielectric material for each mode.

Preferably, the method further comprises the step of choosing the first frequency and the second frequency such that they differ by an amount corresponding to the desired output frequency.

Preferably, the step of producing the desired output frequency comprises determining the difference between the first frequency and the second frequency.

Preferably, the method further comprises the step of choosing the first frequency and the second frequency so that, for a desired temperature range, the first frequency and the second frequency change by substantially the same amount.

Preferably, the first mode is chosen to be a TE-mode or a quasi TE-mode and the second mode is chosen to be a TM-mode or a quasi TM-mode.

Preferably, the first mode is chosen to be a TM-mode or a quasi TM-mode and the second mode is chosen to be a TE-mode or a quasi TE-mode.

Preferably, the quasi TE-mode and the quasi TM-mode are chosen to be moderate-order whispering gallery modes.

Preferably, the cavity resonator is used in a first loop oscillator of oscillator circuit operable at the first frequency and in a second loop oscillator of oscillator circuit operable at the second frequency.

Preferably, said method further comprises the step of Pound stabilising the first loop oscillator.

Preferably, said method further comprises the step of Pound stabilising the second loop oscillator.

More preferably, the step of producing the desired output frequency comprises the steps of:

Mixing the first frequency and the second frequency to produce the desired output frequency;

Amplifying the desired output frequency;

Mixing the amplified desired output frequency and the first frequency to reproduce the second frequency;

Performing the mixing steps and the amplification step within the second loop oscillator; and Reducing the noise effects of amplification and mixing on the desired output frequency using Pound stabilisation.

BRIEF DESCRIPTION OF THE DRAWINGS

One embodiment of this invention will now be described, by way of example, with reference to the accompanying drawings, in which:

FIG. 1b is a graph of the temperature dependence of a 7.2 GHz TE-mode in the dielectrically loaded cavity resonator of FIG. 1a;

DETAILED DESCRIPTION OF THE PREFERRED EMBODIMENT

Figure 1A:
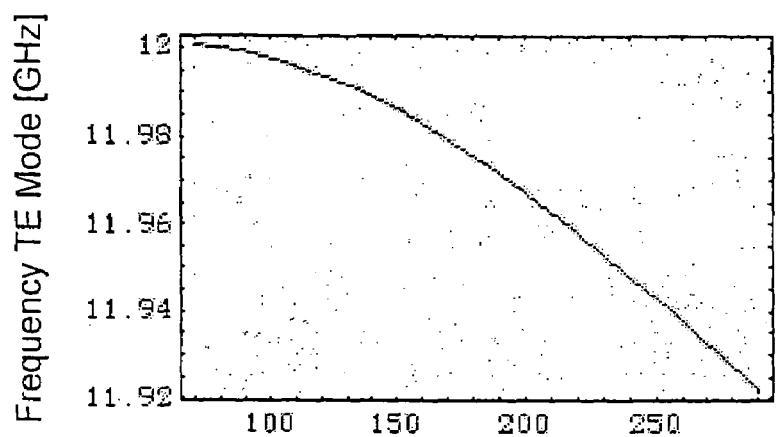
FIG. 1a is a graph of the temperature dependence of a 12 GHz TM-mode in a dielectrically loaded cavity resonator.

The embodiment makes use of the anisotropic properties of a dielectric material such as sapphire, to produce an oscillator that produces a desired frequency which is substantially constant with changes in temperature over a desired temperature range.

The embodiment will be described with reference to cavity resonators using sapphire as the anisotropic dielectric material. However, it should be appreciated that the invention is applicable to other anisotropic dielectric materials. Throughout the description of the embodiment, the term TE-mode will be used to denote a TE-mode or a quasi TE-mode, and the term TM-mode will be used to denote a TM-mode or a quasi TM-mode, as appropriate.

In the embodiment to be described, a dielectrically loaded cavity resonator is designed to be operable at a first frequency in a first mode and operable at a second frequency in a second mode, as described below. The primary criteria for the first and second frequencies is that their difference should correspond with the desired operating frequency.

A nominal first frequency is determined and the first mode of operation is chosen to be either a TM-mode or a TE-mode. This determines the dimensions of the cavity resonator and the dielectric material. The change in the nominal first frequency over a chosen temperature range is then calculated according to the thermal coefficient of permittivity of the dielectric material in the chosen first mode. $TCP_z$ is used where the first mode is a TM-mode and $TCP_\perp$ is used where the first mode is a TE-mode. The temperature range chosen will correspond with a desired operating temperature of the oscillator.

Nominal second frequencies can then be calculated as frequencies close to nominal first frequency±the desired operating frequency.

The range of possible second modes, having regard to the dimensions of the cavity resonator and the dielectric material, is then restricted to the opposite type to the first mode, thus the second mode will be a TE-mode where the first mode is a TM-mode and vice versa. Accordingly, the second frequencies will vary with temperature according to a different thermal coefficient of permittivity, $TCP_z$ or $TCP_\perp$.

The possible modes for the nominal second frequencies are then analysed to determine the possible combinations and their change in frequency over the chosen temperature range.

The difference between the nominal first frequency and the nominal second frequencies is then calculated over the desired temperature range. These differences are analysed and a nominal second frequency and corresponding second mode is chosen which gives the desired operating frequency with minimal variation in frequency over the desired temperature range.

The temperature variation of the desired operating frequency can be calculated as:

$$\frac{df}{dT}\bigg|_{TE-TM} \approx -\frac{1}{2}[f_{TE}TCP_\perp - f_{TM}TCP_Z]$$

where, $f_{TE}$ is the frequency of the TE-mode; and
$f_{TM}$ is the frequency of the TM-mode.

To achieve the lowest variation in frequency of the desired output frequency with changes in temperature, $$\frac{df}{dT}\bigg|_{TE-TM}$$

should be as close to zero as possible over the desired temperature range.

It should be appreciated that the design process may involve several iterations to achieve the desired output frequency.

For a given nominal first frequency, an operating mode may not exist at the exact nominal second frequency required to produce the desired output frequency. However, the actual second frequency chosen will usually be close to the nominal second frequency required to produce the desired output frequency. To tune the output frequency to be closer to desired output frequency, the aspect ratio of the dielectric material may be altered, so as to alter the spacing between the first and second frequencies at the chosen modes. Further tuning may be achieved by altering the aspect ratio of the cavity in which the dielectric material is placed. Still further tuning may be possible using known techniques such as tuning slugs.

Figure 1B:
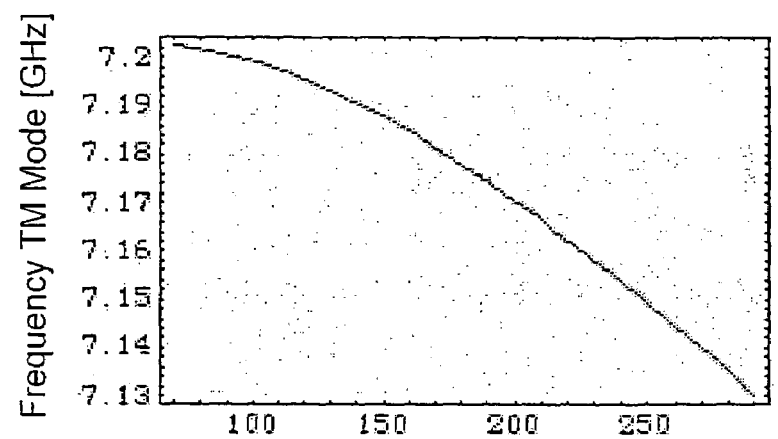
Figure 1C:
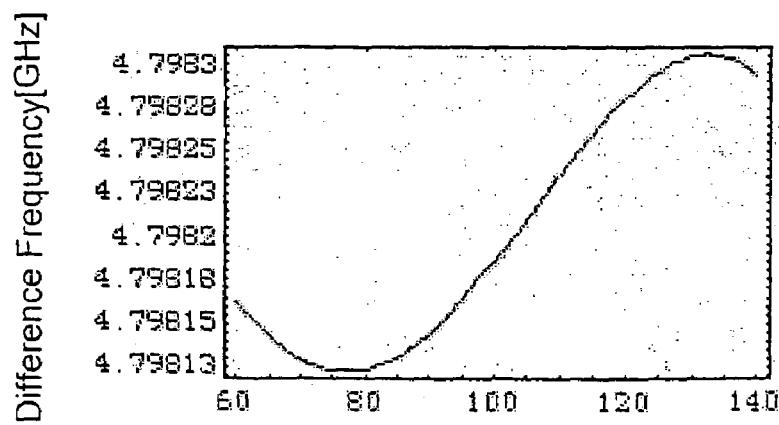
FIG. 1c is a graph of the temperature dependence of the difference between the 12 GHz TM-mode and the 7.2 GHz TE-mode in accordance with the embodiment of this invention.

FIGS. 1A–1C illustrate this principle. FIG. 1A shows the variation in a first frequency, nominally 12 GHz, operating in a TE-mode in a cavity resonator loaded with sapphire, over a temperature range from 70K to 290K.

FIG. 1B shows the variation in a second frequency, nominally 7.2 GHz, operating in a TM-mode in the same cavity resonator as FIG. 1A, over a temperature range from 70K to 290K.

FIG. 1C shows the difference between the first frequency shown in FIG. 1A and the second frequency shown in FIG. 1B over the temperature range 60K to 140K. As shown, the difference frequency is substantially constant between 75K and 80K, and also between 130K and 135K. Conventional thermal control systems may be employed to maintain the operating temperature within these ranges, thus providing an output frequency that is substantially constant with temperature changes over the operating temperature range.

Figure 2A:
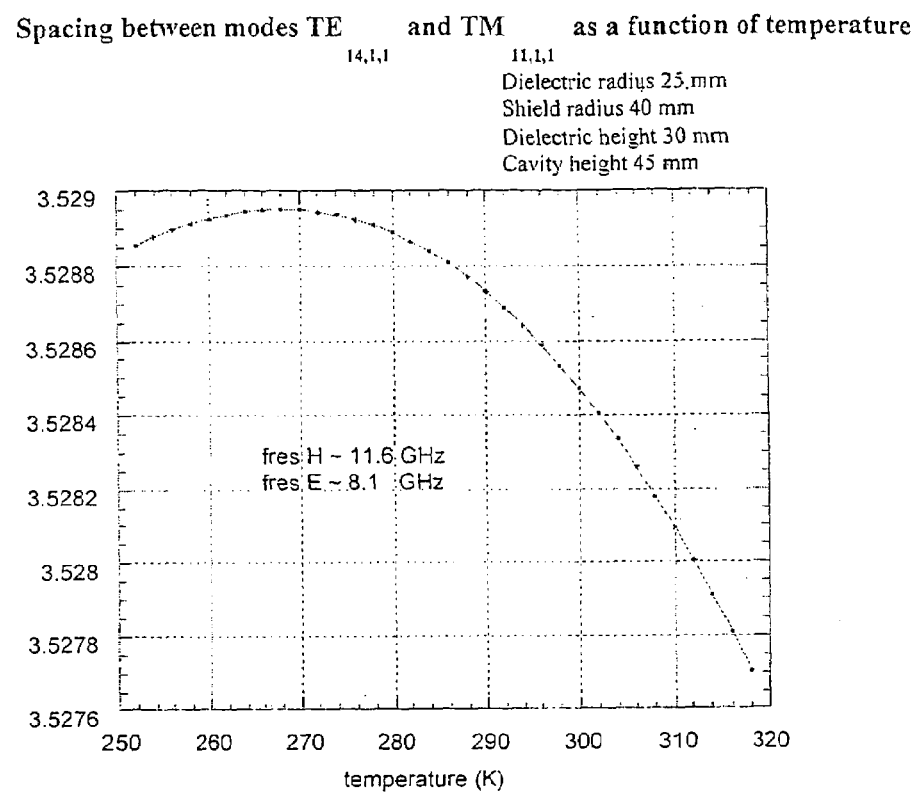
FIGS. 2a and 2b are graphs of the temperature dependence of alternative mode combinations in accordance with the embodiment of this invention.
Figure 2B:
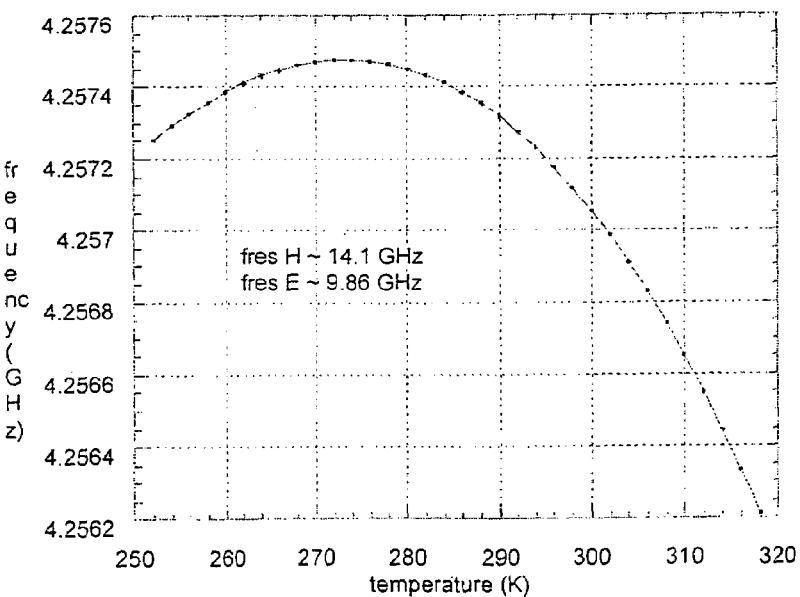

FIGS. 2A and 2B show two further examples of the difference between a first and second frequencies over a range of temperatures.

Figure 3:
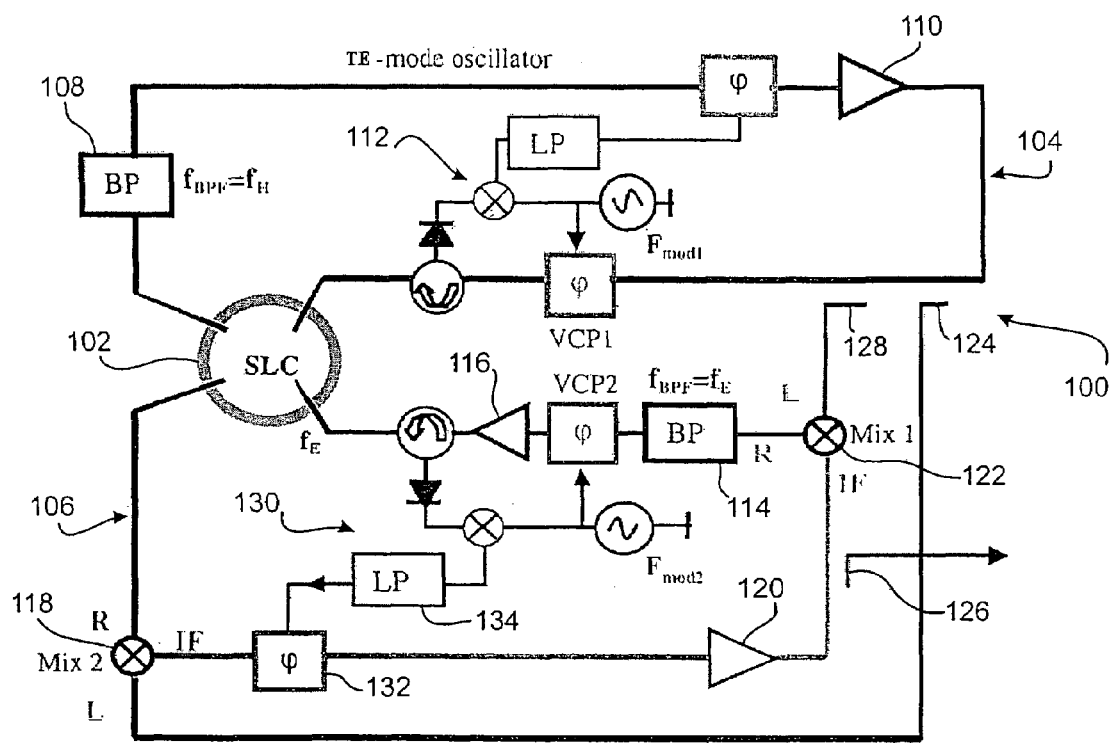
FIG. 3 is a circuit diagram of an example oscillator circuit in accordance with the embodiment of this invention.

FIG. 3 shows an example of one possible oscillator circuit 100 using a sapphire loaded cavity ("SLC") resonator 102 designed as described above. The oscillator circuit shown in FIG. 3 uses the Pound-stabilisation technique, as disclosed in R. V. Pound (1946), "Electronic Frequency Stabilization of Microwave Oscillators", *Rev. Sci. Instr.*, Vol. 17 No. 11, pp. 490–505, the contents of which are incorporated herein by reference.

The oscillator circuit 100 comprises a first loop oscillator 104 and second loop oscillator 106.

The first loop oscillator 104 is arranged to oscillate at a first frequency in a TE-mode The first loop oscillator 104 comprises the dielectrically loaded cavity resonator 102 as a frequency determining element, a band-pass filter 108 at the first frequency and a first microwave amplifier 110 provided in a loop. The first loop oscillator 104 includes a first Pound-stabilisation circuit 112.

The second loop oscillator 106 is arranged to oscillate at a second frequency in a TM-mode. The second loop oscillator 106 comprises the dielectrically loaded cavity resonator 102 as a frequency determining element, a band-pass filter 114 at the second frequency, and a second microwave amplifier 116 operable at the second frequency provided in a loop.

The second loop oscillator 106 further comprises a first mixer 118, a third microwave amplifier 120 operable at the desired output frequency, and a second mixer 122 provided in the loop.

The mixer 118 is responsive to the second frequency output from the cavity resonator 102 and to the first frequency in the first loop oscillator 104 via a first coupler 124. The mixer 118 produces the desired output frequency from the input first frequency and second frequency, which is input to the third microwave amplifier 120.

A second coupler 126 is provided at the output of the third microwave amplifier 120 to provide an output at the desired output frequency.

The mixer 122 is responsive to the desired output frequency from the third microwave amplifier 120 and to the first frequency in the first loop oscillator 104 via a first coupler 128. The mixer 122 produces the second frequency from the input desired output frequency and second frequency, which is input to the bandpass filter 114.

The first mixer 118, the third microwave amplifier 120, the second mixer 122, and couplers 124, 126, 128 act to provide the desired output frequency from the first and second frequencies, and also act to lock the second loop oscillator 106 to the first loop oscillator 104.

The second loop oscillator 106 includes a second Pound-stabilisation circuit 130. A voltage-controlled phase-shifter 132 of the second Pound-stabilisation circuit 130 is provided at the input of the third microwave amplifier 120. The gain of a low-pass filtering and signal conditioning circuit 134 that controls the voltage-controlled phase-shifter 132 may be adjusted, if required, to compensate for the voltage-controlled phase-shifter 132 operating at the desired output frequency rather than at the second frequency of the second loop oscillator 106.

The embodiment provides an oscillator having improved temperature stability. It should be appreciated that other oscillator configurations may also be used.

It should be appreciated that the scope of this invention is not limited to the particular embodiment described above.

What is claimed is:

1. An oscillator having a desired output frequency, comprising:

a cavity resonator loaded with an anisotropic dielectric material; and an oscillator circuit including the cavity resonator as a frequency determining element, the oscillator circuit arranged to operate the cavity resonator at a first frequency in a first mode and at a second frequency in a second mode, the first mode and the second mode each being influenced to a different extent by the thermal coefficient of permittivity of at least one crystal axis of the dielectric material, the oscillator circuit arranged to produce the desired operating frequency from the first frequency and the second frequency.

2. An oscillator as claimed in claim 1, wherein the first mode and the second mode are each influenced by the thermal coefficient of permittivity of a different crystal axis of the dielectric material.

3. An oscillator as claimed in claim 1, wherein the first frequency and the second frequency differ by an amount corresponding to the desired output frequency.

4. An oscillator as claimed in claim 1, wherein the oscillator circuit comprises mixing means responsive to the first frequency and the second frequency to produce the desired output frequency.

5. An oscillator as claimed in claim 1, wherein the first frequency and the second frequency are chosen so that for a desired temperature range, the first frequency and the second frequency change by substantially the same amount.

6. An oscillator as claimed in claim 1, wherein the first mode is a TE-mode or a quasi TE-mode and the second mode is a TM-mode or a quasi TM-mode.

7. An oscillator as claimed in claim 1, wherein the first mode is a TM-mode or a quasi TM-mode and the second mode is a TE-mode or a quasi TE-mode.

8. An oscillator as claimed in claim 5, wherein the quasi TE-mode and the quasi TM-mode are moderate-order whispering gallery modes.

9. An oscillator as claimed in claim 1, wherein the oscillator circuit further comprises a first loop oscillator operable at the first frequency and a second loop oscillator operable at the second frequency.

10. An oscillator as claimed in claim 9, wherein the first loop oscillator includes a first Pound stabilization circuit.

11. An oscillator as claimed in claim 9, wherein the second loop oscillator includes a second Pound stabilization circuit.

12. An oscillator as claimed in claim 11, wherein the second loop oscillator further comprises a first mixer, a microwave amplifier operable at the desired output frequency, and a second mixer provided in the loop of the second loop oscillator, the first mixer being responsive to the first frequency and the second frequency to produce the desired output frequency, the desired output frequency being input to the microwave amplifier, and the second mixer being responsive to the desired output frequency and the first frequency to produce the second frequency, wherein the second Pound stablization circuit is arranged to reduce noise effects of the microwave amplifier and the first and second mixers.

13. A method for producing a desired output frequency, comprising the steps of:
    using a cavity resonator loaded with an anisotropic dielectric material as a frequency determining element in an oscillator circuit at a first frequency in a first mode and at a second frequency in a second mode;
    choosing the first mode and the second mode to each be influenced to a different extent by the thermal coefficient of permittivity of at least one crystal axis of the dielectric material; and
    producing the desired output frequency from the first frequency and the second frequency.

14. A method as claimed in claim 13, wherein the step of choosing the first mode and the second mode comprises determining different crystal axes of the dielectric material for each mode.

15. A method as claimed in claim 13, further comprising the step of choosing the first frequency and the second frequency such that they differ by an amount corresponding to the desired output frequency.

16. A method as claimed in claim 13, wherein the step of producing the desired output frequency comprises determining the difference between the first frequency and the second frequency.

17. A method as claimed in claim 13, further comprising the step of choosing the first frequency and the second frequency so that for a desired temperature range, the first frequency and the second frequency change by substantially the same amount.

18. A method as claimed in claim 13, wherein the first mode is chosen to be a TE-mode or a quasi TE-mode and the second mode is chosen to be a TM-mode or a quasi TM-mode.

19. A method as claimed in claim 13, wherein the first mode is chosen to be a TM-mode or a quasi TM-mode and the second mode is chosen to be a TE-mode or a quasi TE-mode.

20. A method as claimed in claim 18, wherein the quasi TE-mode and the quasi TM-mode are chosen to be moderate-order whispering gallery modes.

21. A method as claimed in claim 13, wherein the cavity resonator is used in a first loop oscillator of oscillator circuit operable at the first frequency and in a second loop oscillator of oscillator circuit operable at the second frequency.

22. A method as claimed in claim 21, further comprising the step of Pound stabilization the first loop oscillator.

23. A method as claimed in claim 21, further comprising the step of Pound stabilization the second loop oscillator.

24. A method as claimed in claim 21, wherein the step of producing the desired output frequency comprises the steps of:
    mixing the first frequency and the second frequency to produce the desired output frequency;
    amplifying the desired output frequency;
    mixing the amplified desired output frequency and the first frequency to reproduce the second frequency;
    performing the mixing steps and the amplification step within the second loop oscillator; and
    reducing the noise effects of amplification and mixing on the desired output frequency using Pound stabilization.

* * * * *